United States Patent
Kim et al.

(10) Patent No.: US 8,363,482 B2
(45) Date of Patent: Jan. 29, 2013

(54) FLASH MEMORY DEVICES WITH SELECTIVE BIT LINE DISCHARGE PATHS AND METHODS OF OPERATING THE SAME

(75) Inventors: Euido Kim, Ansan-si (KR); BongYong Lee, Suwon-si (KR); Haebum Lee, Suwon-si (KR); Sang-Youl Kwon, Suwon-si (KR); Jin-Young Kim, Seoul (KR); Hye Yeon Yun, Suwon-si (KR); Houng-kuk Jang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 134 days.

(21) Appl. No.: 12/813,050

(22) Filed: Jun. 10, 2010

(65) Prior Publication Data
US 2011/0216602 A1    Sep. 8, 2011

(30) Foreign Application Priority Data
Mar. 2, 2010 (KR) ........................ 10-2010-0018658

(51) Int. Cl.
*G11C 11/34* (2006.01)
(52) U.S. Cl. .............................. 365/185.25; 365/185.22
(58) Field of Classification Search ............. 365/185.22, 365/185.25
See application file for complete search history.

(56) References Cited

U.S. PATENT DOCUMENTS

| 6,545,915 B2 | 4/2003 | Ohtani et al. | |
|---|---|---|---|
| 2002/0091893 A1 | 7/2002 | Kaya et al. | |
| 2003/0210581 A1 * | 11/2003 | Lee et al. | 365/200 |
| 2009/0310414 A1 * | 12/2009 | Lee et al. | 365/185.17 |

FOREIGN PATENT DOCUMENTS

| JP | 09-153559 | 10/1997 |
|---|---|---|
| KR | 1997-0004072 | 3/1997 |
| WO | WO 9408340 A1 | 4/1994 |

* cited by examiner

*Primary Examiner* — Anthan Tran
(74) *Attorney, Agent, or Firm* — Myers Bigel Sibley & Sajovec, P.A.

(57) ABSTRACT

Provided is a flash memory device that can include a memory cell configured to store data, a local bit line that is connected to the memory cell, a global bit line that is connected to the local bit line, a discharge transistor that is connected to the global bit line, and that is configured to selectively connect the global bit line to a reference level responsive to a discharge control signal, and a discharge control circuit, that is connected to the discharge transistor via the discharge control signal, and that is configured to selectively disable the discharge transistor during an erase interval occurring before a verify interval of an erase verification operation carried out by the flash memory device.

12 Claims, 11 Drawing Sheets

US 8,363,482 B2

FLASH MEMORY DEVICES WITH SELECTIVE BIT LINE DISCHARGE PATHS AND METHODS OF OPERATING THE SAME

CROSS-REFERENCE TO RELATED APPLICATIONS

This U.S. non-provisional patent application claims priority under 35 U.S.C. §119 of Korean Patent Application No. 10-2010-0018658, filed on Mar. 2, 2010, the entire contents of which are hereby incorporated by reference.

BACKGROUND

The present disclosure herein relates to a semiconductor memory device, and more particularly, to a flash memory device for improving repair efficiency and an operation method thereof.

A semiconductor memory device is a memory device that is implemented with semiconductors such as silicon (Si), germanium (Ge), gallium arsenide (GaAs) and indium phosphide (InP). Semiconductor memory devices can be categorized as either volatile memory devices or nonvolatile memory devices.

A volatile memory device is a memory device in which stored data is lost when a power source voltage is shut off. Some examples of volatile memory devices include: Static Random Access Memory (SRAM), Dynamic Random Access Memory (DRAM) and Synchronous Dynamic Random Access Memory (SDRAM). A non-volatile memory device is a memory device that retains stored data even when a power source voltage is shut off. Some examples of non-volatile memory devices include: Read-Only Memory (ROM), Programmable Read Only Memory (PROM), Erasable Programmable Read Only Memory (EPROM), Electrical Erasable Programmable Read Only Memory (EEPROM), flash memory device, Phase-change Random Access Memory (PRAM), Magnetoresistive Random Access Memory (MRAM), Resistive Random Access Memory (RRAM) and Ferroelectric Random Access Memory (FRAM). The flash memory devices can be categorized as NOR type or NAND type.

A NOR type flash memory has a structure in which a plurality of cell transistors are connected to one bit line in parallel. The NOR type flash memory stores data in a channel hot electron scheme, and erases data in a Fowler-Nordheim (F-N) tunneling scheme. On the other hand, a NAND type flash memory has a string structure in which a plurality of cell transistors are serially connected to one bit line. The NAND type flash memory stores and erases data in the F-N tunneling scheme.

SUMMARY

Embodiments of the inventive concept can provide a flash memory device that can include a memory cell configured to store data, a local bit line that is connected to the memory cell, a global bit line that is connected to the local bit line, a discharge transistor that is connected to the global bit line, and that is configured to selectively connect the global bit line to a reference level responsive to a discharge control signal, and a discharge control circuit, that is connected to the discharge transistor via the discharge control signal, and that is configured to selectively disable the discharge transistor during an erase interval occurring before a verify interval of an erase verification operation carried out by the flash memory device.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

For conciseness, embodiments of the inventive concept will be described below with reference to a NOR type flash memory device. However, a flash memory device according to embodiments of the inventive concept is not limited to the NOR type flash memory device. Exemplarily, the spirit and scope of the inventive concept may be applied to a nonvolatile memory device such as ROM, PROM, EPROM, EEPROM, MRAM, PRAM, RRAM, FRAM and NAND type flash memory device.

Figure 1:
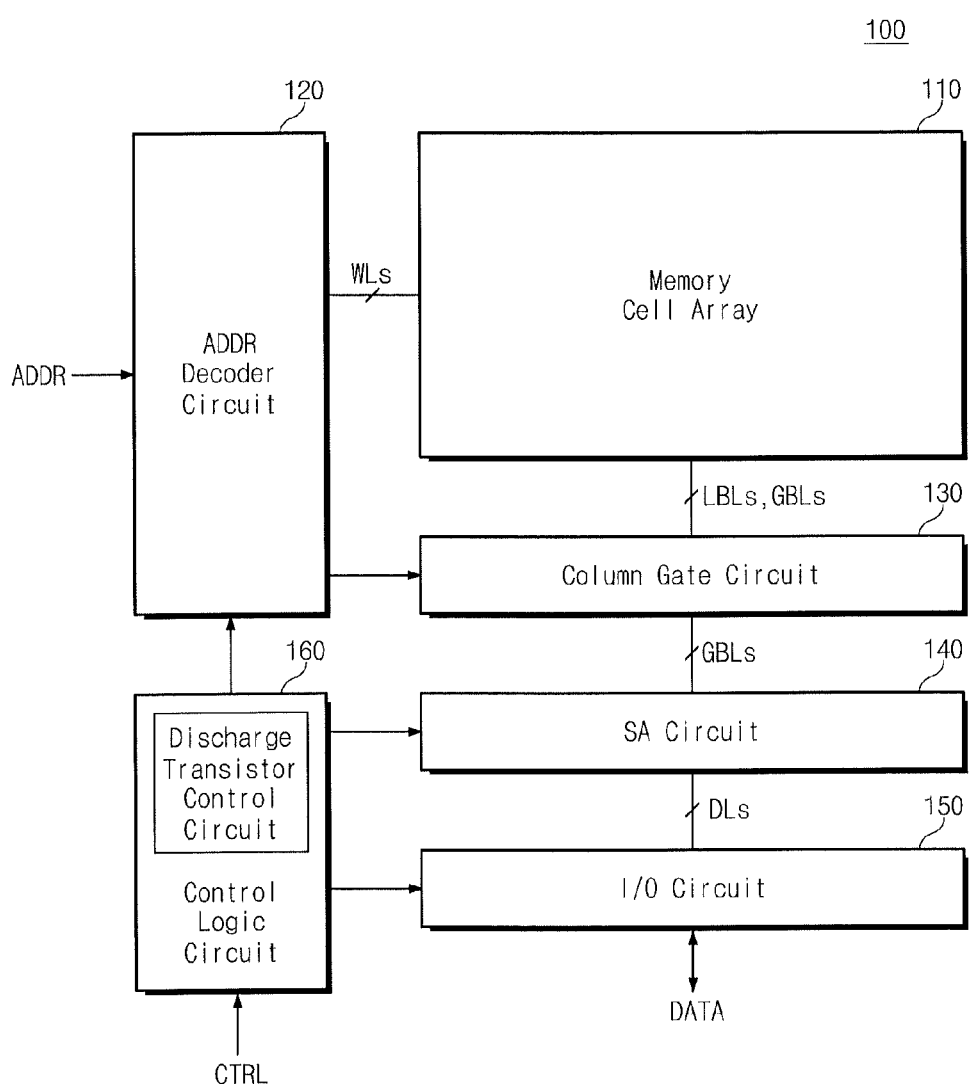
FIG. 1 is a block diagram illustrating a flash memory device according to an embodiment of the inventive concept.

FIG. 1 is a block diagram illustrating a flash memory device according to an embodiment of the inventive concept.

Referring to FIG. 1, a flash memory device 100 according to an embodiment of the inventive concept includes a memory cell array 110, an address decoder 120, a column gate circuit 130, a sense amplifier 140, a data input/output (I/O) circuit 150, and a control logic circuit 160.

The memory cell array 110 is connected to the address decoder 120 through word lines WLs, and is connected to the column gate circuit 130 through local bit lines LBLs and global bit lines GBLs. The memory cell array 110 includes a plurality of memory cells that are arranged in a matrix. Data are written and read in/from a memory cell that corresponds to a word line selected by the address decoder 120 and a bit line selected by the column gate circuit 130.

The address decoder 120 operates according to the control of the control logic circuit 160. The address decoder 120 may include elements such as an address buffer, a row address decoder and a column address decoder. The address decoder 120 receives an address ADDR from which a row address and a column address is decoded. The address decoder 120 selects word lines WLs according to the decoded row address. The address decoder 120 provides the decoded column address to the column gate circuit 130.

The address decoder 120 transfers word line voltages such as a programming voltage, a pass voltage, a selection read voltage, a non-selection read voltage and a verification reference voltage that are provided from a voltage generator (not shown), to word lines.

The column gate circuit 130 is connected to the memory cell array 110 through the local bit lines LBLs and the global bit lines GBLs, and is connected to the sense amplifier 140 through the global bit lines GBLs. The column gate circuit 130 selects the local bit lines LBLs and the global bit lines GBLs according to the decoded column address that is transferred from the address decoder 120.

The sense amplifier 140 is connected to the column gate circuit 130 through the global bit lines GBLs. The sense amplifier 140 senses and amplifies data that are stored in a memory cell connected to the local bit lines LBLs and the global bit lines GBLs that are selected by the column gate circuit 130. Moreover, the sense amplifier 140 provides data, which are transferred from the data input/output circuit 150 through data lines DLs, to the column gate circuit 130 for writing the data in the selected memory cell. The sense amplifier 140 operates according to the control of the control logic circuit 160.

The data input/output circuit 150 is connected to the sense amplifier 140 through the data lines DLs. The data input/output circuit 150 may include an element such as a data buffer. The data input/output circuit 150 provides external data DATA to the sense amplifier 140. The data input/output circuit 150 transfers the data DATA, which is provided from the sense amplifier 140, to the outside. The data input/output circuit 150 operates according to the control of the control logic circuit 160.

The control logic circuit 160 is connected to the address decoder 120, the column gate circuit 130, the sense amplifier 140, and the data input/output circuit 150. The control logic circuit 160 controls the main operation of the flash memory device 100. The control logic circuit 160 operates in response to a control signal CTRL that is transferred from the outside.

Figure 2:
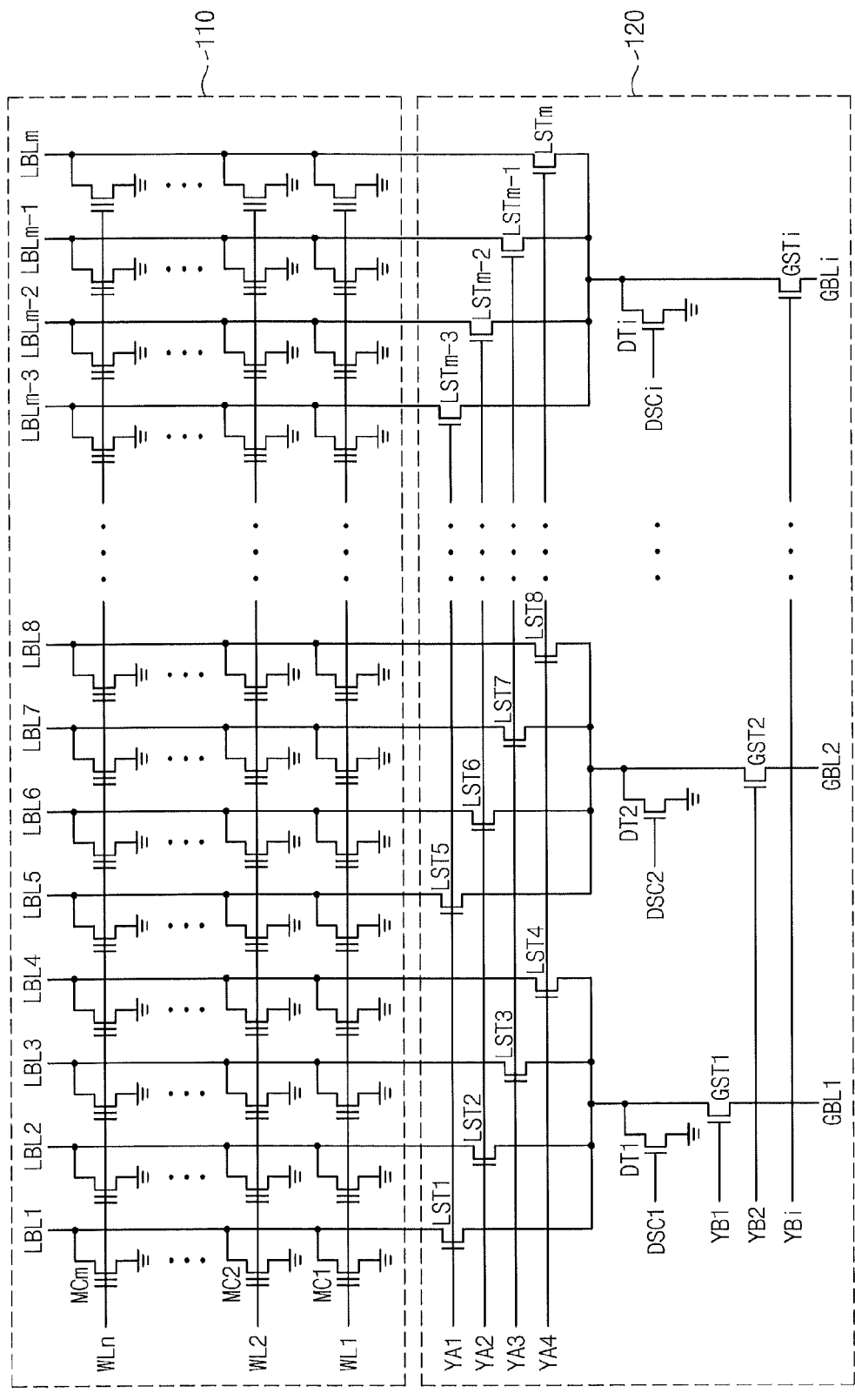
FIG. 2 is a circuit diagram illustrating a memory cell array and column gate circuit of a flash memory device according to an embodiment of the inventive concept.

FIG. 2 is a circuit diagram illustrating a memory cell array and column gate circuit of a flash memory device according to an embodiment of the inventive concept. For conciseness, one memory block among a plurality of memory blocks in the memory cell array 110 is illustrated.

Referring to FIG. 2, the memory cell array 110 includes word lines WL1 to WLn, local bit lines LBL1 to LBLm, and memory cells MC1 to MCn. Although not shown, the memory cell array 110 may include global bit lines GBL1 to GBLi. However, the global bit lines GBL1 to GBLi are not directly connected to the memory cells MC1 to MCn but are connected to them through the local bit lines LBL1 to LBLm.

Herein, it is assumed that four local bit lines are connected to each global bit line. Exemplarily, first to fourth local bit lines LBL1 to LBL4 are connected to a first global bit line GBL1.

The memory cells MC1 to MCn are connected to the local bit lines LBL1 to LBLm in parallel, respectively. The drains of memory cells MC1 to MCn are connected to the local bit lines LBL1 to LBLm corresponding to them, respectively. The sources of the memory cells MC1 to MCn are respectively connected to source lines (not shown) or are grounded. The control gates of the memory cells MC1 to MCn are connected to the word lines WL1 to WLn corresponding to them, respectively.

The column gate circuit 120 includes local selection transistors LST1 to LSTm for selecting the local bit lines LBL1 to LBLm, global selection transistors GST1 to GSTi for selecting the global bit lines GBL1 to GBLi, and discharge transistors DT1 to DTi for discharging the global bit lines GBL1 to GBLi.

The local selection transistors LST1 to LSTm select the local bit lines LBL1 to LBLm in response to local selection signals YA1 to YA4. The global selection transistors GST1 to GSTi select the global bit lines GBL1 to GBLi in response to global selection signals YB1 to YBi. Herein, the local selection signals YA1-YA4 and the global selection signals YB1 to YBi are generated by the address decoder circuit 120 (see FIG. 1, particularly, a column address decoder circuit)

The discharge transistors DT1 to DTi discharge the global bit lines GBL1 to GBLi corresponding to them in response to discharge control signals DSC1 to DSCi, respectively. When the discharge transistors DT1 to DTi are turned on, current movement paths are formed between the global bit lines GBL1 to GBLi and a ground, thereby discharging the global bit lines GBL1 to GBLi. On the other hand, when the discharge transistors DT1 to DTi are turned off, the current movement paths are broken between the global bit lines GBL1 to GBLi and a ground, thereby floating the global bit lines GBL1 to GBLi.

Although not shown, the flash memory device 100 (see FIG. 1) according to an embodiment of the inventive concept may include a discharge control signal generation circuit that generates the discharge control signals DSC1 to DSCi. The discharge control signal generation circuit may operate according to the control of the control logic circuit 160. In some embodiments according to the inventive concept, the discharge control signal generation circuit is included in the control logic circuit 160. In operation, the discharge control signal generation circuit generates the discharge control signals responsive to the timing of the different intervals within the verify interval. For example, the generation circuit can generate the discharge control signals responsive to the timing of when the setup interval (included within the verify interval) begins and, further, can be disabled at the conclusion of the setup interval, or at least prior to the beginning of the pre-charge interval.

It will be understood the voltage levels utilized for the discharge control signals can be chosen so as to be appropriate for the particular technology used to implement the discharge transistors. Still further, the particular set up and hold times for the discharge control signals can also be determined by the particular system in which the generation circuit operates and, further, the particular technology of the discharge transistors. The generation circuit can be configured so as to keep the discharge control signals in the off position during all other intervals of operation except for the setup interval.

Figure 3:
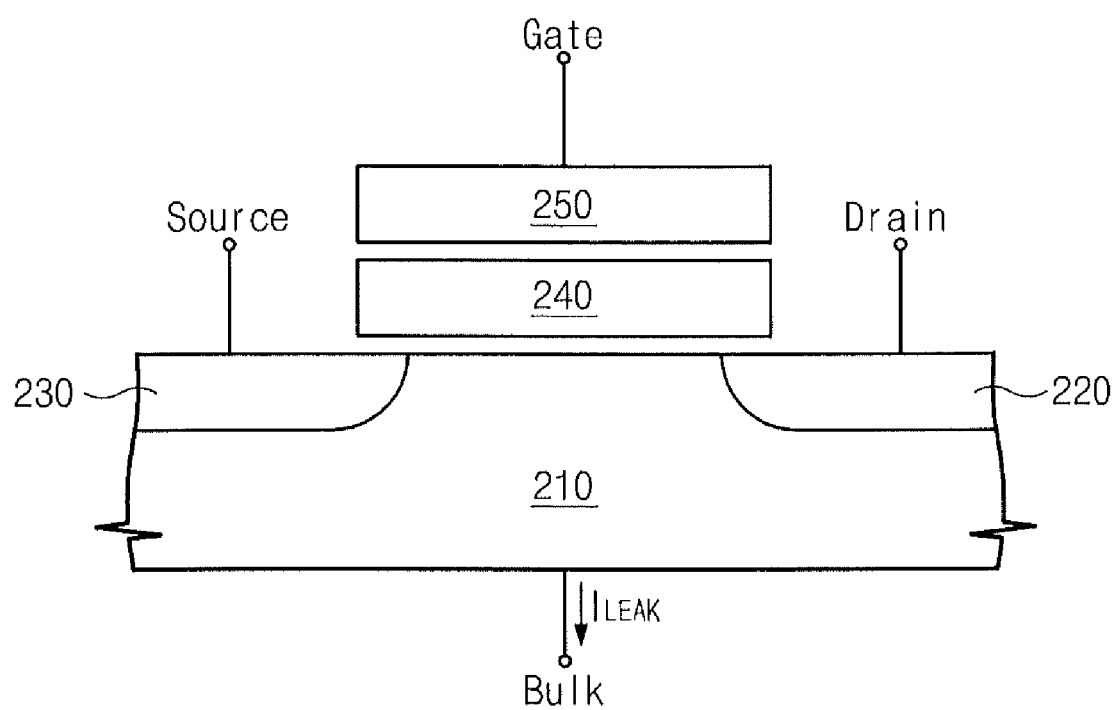
FIG. 3 is a cross-sectional view of a memory cell according to an embodiment of the inventive concept.

FIG. 3 is a cross-sectional view of a memory cell according to an embodiment of the inventive concept.

Referring to FIG. 3, each of the memory cells MC1 to MCn (see FIG. 2) includes a bulk region 210, a drain region 220, a source region 230 and a gate structure.

The bulk region 210 may be formed of poly silicon. The bulk region 210 may be a P-well that is doped with P type impurities. The drain region 220 and the source region 230 are formed in the bulk region 210.

The drain region 220 and the source region 230 may be n+ type regions. The drain region 220 is connected to the local bit lines LBL1 to LBLm (see FIG. 2), and the source region 230 is connected to a source line or a ground.

The gate structure is provided on the bulk region 210 between the drain regions 220 and the source region 230. The gate structure includes a floating gate 240 and a control gate 250. Herein, a tunnel dielectric is provided between the bulk region 210 and the floating gate 240. Moreover, a blocking dielectric is provided between the floating gate 240 and the control gate 250.

In the case of a semiconductor memory device, Electrical Die Sorting (EDS) is performed at a wafer level to screen for failed (i.e., defective) chips. For determining whether a chip has failed, a wafer burn-in test that applies an electrical stress to the chips is performed. This is similar to the erase operation of the flash memory device. In a wafer burn-in test for the flash memory device, a negative voltage is applied to the gates of the memory cells MC1 to MCn, and a positive voltage is applied to the bulk region 210. At this point, a leakage current $I_{LEAK}$ flowing in the bulk region 210 is measured, and when the amount of the leakage current $I_{LEAK}$ is equal to or greater than a particular level, the chip is determined to be defective.

As a method for solving a failure due to the defect of a manufacture process, a repair scheme of bit, column, row and block units may be used. It is assumed that the flash memory device according to an embodiment of the inventive concept uses a repair scheme of a column unit. That is, when failures arise in some columns of a memory cell array, fail columns may be replaced by other spare columns in a repair scheme of a column unit.

Generally, the local bit lines LBL1 to LBLm and the global bit lines GBL1 to GBLi (see FIG. 2) are configured with the metal lines of another layer. However, the metal lines of the other layer may be connected to each other because of the defect as described above, and thus the local bit lines LBL1 to LBLm and the global bit lines GBL1 to GBLi can be shorted together. Alternatively, a source line connected to the local bit lines LBL1 to LBLm and the global bit lines GBL1 to GBLi can be shorted together. Consequently, a leakage current $I_{LEAK}$ may flow in the bulk region 210 through a leakage path between the local bit lines LBL1 to LBLm or the source line and the global bit lines GBL1 to GBLi.

In a wafer burn-in test, when an erase operation of a memory block unit fails due to a leakage current $I_{LEAK}$, the particular chip can be designated as defective. In a flash memory device to which a repair scheme of a column unit is applied, furthermore, when a failure due to an abnormal erase operation arises, a chip for test is determined as one incapable of repair and is screened.

As a result, a failure having such a type, which arises in the flash memory device to which the repair scheme of the column unit is applied, is one of the factors that decreases yield. According to the operation method of the flash memory device, by breaking a leakage path in an erase operation, the operation method enables the result of a wafer burn-in test to be "forced" to passed. Accordingly, even though failures may arise in some columns because of the defect of a manufacture process, a chip may not be screened during the wafer burn-in test stage. Subsequently, in a functional test stage, a chip undergoing test can be repaired by applying a repair scheme of a column unit.

In other words, as described above, if a chip has a defect that causes leakage current, that chip may nonetheless be repairable. However, conventional screening of chips may deem such chips to be defective once the burn in test is complete, despite the fact that the chip may be repairable. Accordingly, in some embodiments according to the inventive concept, the leakage current defect can effectively be ignored to determine whether the chip can ultimately be repaired, before deciding whether the chip should be screened out.

Figure 4:
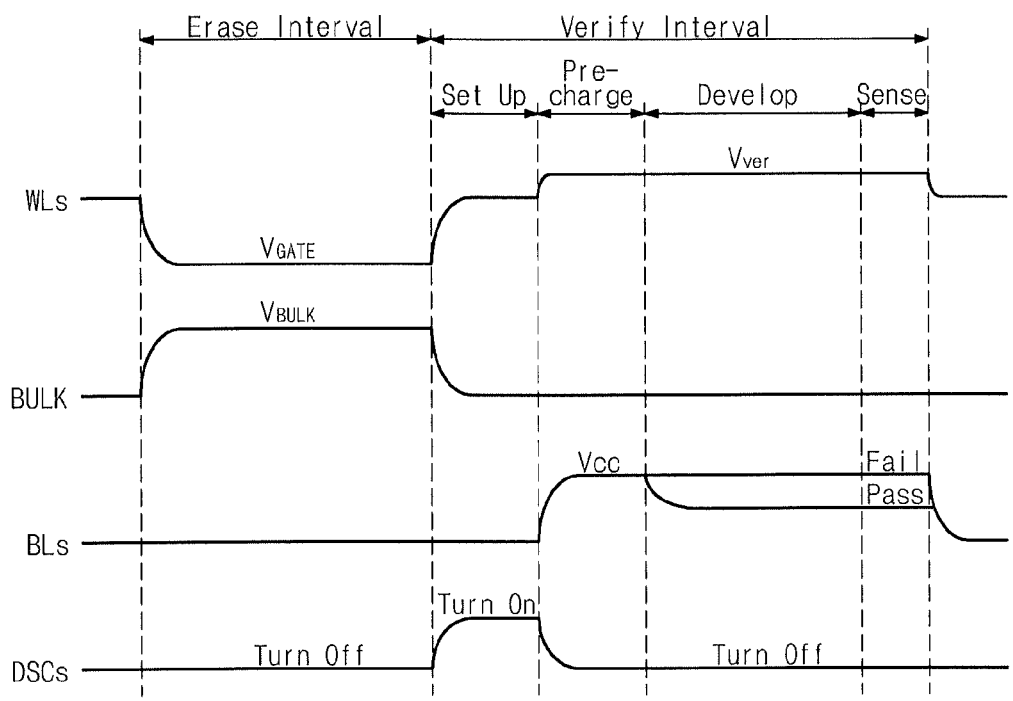
FIG. 4 is a timing diagram for describing an operation method of a flash memory device according to an embodiment of the inventive concept.

FIG. 4 is a timing diagram for describing an operation method of a flash memory device according to an embodiment of the inventive concept.

Referring to FIG. 4, an erase operation may be divided into an erase interval and a verification interval. The verification interval may be further separated into a setup interval, a pre-charge interval, a development interval and a sense interval.

The flash memory device 100 (see FIG. 1) may perform the erase operation in memory block units. In the erase interval, a negative gate voltage $V_{GATE}$ is applied to the word lines WLs, and a positive bulk voltage $V_{BULK}$ is applied to a bulk region BULK. The drains and sources of the memory cells MC1 to MCn (see FIG. 2) are maintained in a floating state. Herein, the drains and sources of the memory cells MC1 to MCn may be charged with a positive voltage because of a bias based on the positive bulk voltage $V_{BULK}$. Discharge control signals DSCs are deactivated for the discharge transistors DT1 to DTi (see FIG. 2) to be turned off.

As described above, the drains of the memory cells MC1 to MCn are connected to the local bit lines LBL1 to LBLm (see FIG. 2). In the erase interval, the local bit lines LBL1 to LBLm are not selected and are in a floating state. Accordingly, the local bit lines LBL1 to LBLm may be charged with a positive voltage, likewise with the memory cells MC1 to MCn.

When the local bit lines LBL1 to LBLm or the sources of the memory cells MC1 to MCn and the global bit lines GBL1 to GBLi (see FIG. 2) are shorted due to the defect of a manufacture process, a leakage path is formed. At this point, when the discharge transistors DT1 to DTi have been turned off, the sources of the memory cells MC1 to MCn and the local bit lines LBL1 to LBLm that have been charged with a positive voltage cannot be discharged through the discharge transistors DT1 to DTi. That is, by turning off the discharge transistors DT1 to DTi in the erase interval, the leakage current $I_{LEAK}$ can be prevented from flowing in the bulk region BULK.

As a result, although failures arise in some columns due to the defect of a manufacture process, since the leakage current $I_{LEAK}$ is not measured, the result of the wafer burn-in test is determined as a pass. Consequently, a chip for test is not screened in the wafer burn-in test stage. Subsequently, in the function test stage, a chip for test may be repaired by applying a repair scheme of a column unit.

When the erase interval is terminated, a verification operation for erased memory cells is performed in the verification interval. In the verification operation, when the global bit lines GBL1 to GBLi have been charged with a certain voltage, a verification error may occur. To prevent this, the discharge control signals DSCs are activated for the discharge transistors DT1 to DTi to be turned on during the setup interval. Accordingly, the global bit lines GBL1 to GBLi are discharged during the setup interval.

When the setup interval is terminated, a verification reference voltage Vver is applied to the word lines WLs. Bit lines BLs are charged with a power source voltage Vcc during the pre-charge interval. Subsequently, bit lines, which are connected to memory cells in which have been normally erased during the development interval, are discharged to less than a particular voltage. On the other hand, bit lines, which are connected to memory cells in which have been abnormally erased, maintain the power source voltage Vcc. Next, the erased results of the memory cells MC1 to MCn are determined in the sense interval. The discharge control signals DSCs are again deactivated for the discharge transistors DT1 to DTi to be turned off from after the setup interval.

Figure 5:
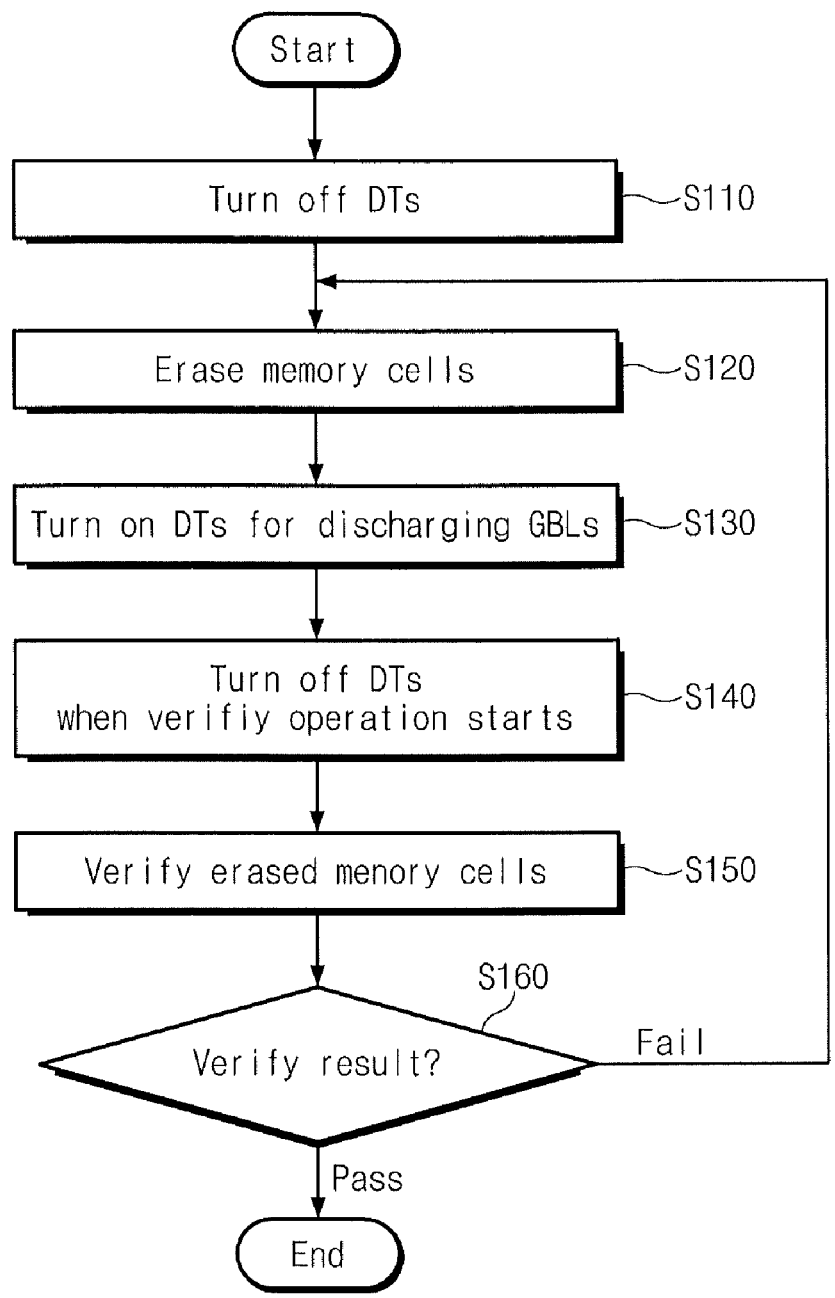
FIG. 5 is a flowchart for describing an operation method of a flash memory device according to an embodiment of the inventive concept.

FIG. 5 is a flowchart for describing an operation method of a flash memory device according to an embodiment of the inventive concept.

Referring to FIG. 5, the discharge transistors DTs are turned off in response to the discharge control signals DSCs during the erase interval in operation S110. In a state where the discharge transistors DTs have been turned off, memory cells are erased in operation S120. As described above, since the discharge transistors DTs are turned off, a leakage path is broken during the erase interval, thereby preventing a leakage current from flowing in the bulk region.

When the erase interval is terminated, a verification operation for the erased memory cells is performed in the verification interval. The discharge transistors DTs are turned on in response to the discharge control signals DSCs during the setup interval for discharging the global bit lines GBL1 to GBLi in operation S130. The global bit lines GBL1 to GBLi are discharged, and the discharge transistors DTs are again turned off at the beginning of the precharge interval before the verification operation starts in operation S140. At this point, the discharge control signals DSCs may be deactivated in response to the verification reference voltage Vver and the power source voltage Vcc that are respectively applied to the word lines and the bit lines in the pre-charge interval. The discharge transistors DTs are maintained in a turned-off state from after the setup interval.

Subsequently, in a state where the discharge transistors DTs have been turned off, a verification operation for the erased memory cells is performed in operation S150. The control logic circuit 160 (see FIG. 1) determines whether a verified result is passed or failed in operation S160. When the verified result is determined as being passed, the erase operation is ended. When the verified result is determined as being passed, operations S130 to S160 after operation S120, in which the memory cells are erased, are repeated.

The flash memory device according to an embodiment of the inventive concept may be applied to various products. The flash memory device according to an embodiment of the inventive concept may be implemented as memory devices such as memory cards, USB memories and Solid State Drives (SSDs) as well as electronic devices such as personal computers, digital cameras, camcorders, portable phones, MP3 players, PMPs, PSPs and PDAs.

Figure 6:
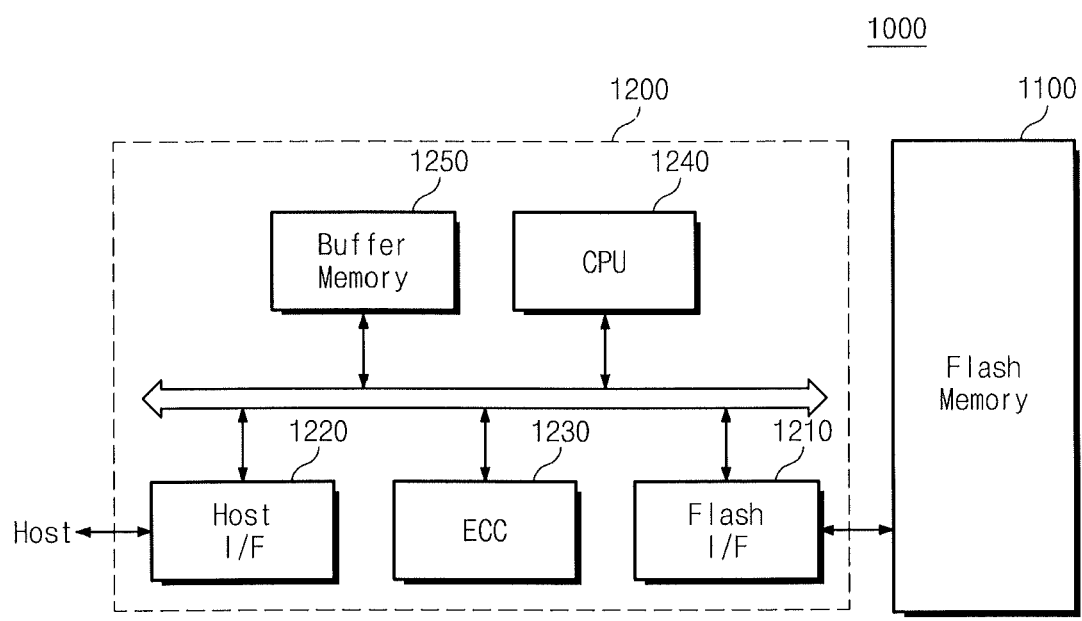
FIG. 6 is a block diagram illustrating a memory system using a flash memory device according to an embodiment of the inventive concept.

FIG. 6 is a block diagram illustrating a memory system using a flash memory device according to an embodiment of the inventive concept.

Referring to FIG. 6, a memory system 1000 according to an embodiment of the inventive concept includes a flash memory device 1100 and a memory controller 1200.

The flash memory device 1100 and the memory controller 1200 may be included in one storage device. Such a storage device may include a portable storage device such as a USB memory and a memory card (for example, MMC, SD card, xD card, CF card and SIM card). Moreover, the storage device may be connected to a host such as a personal computer, a notebook computer, a digital camera, a portable phone, an MP3 player, a PMP, a game machine and be used.

The flash memory device 1100 may perform an erase operation, a writing operation and a read operation according to the control of the memory controller 1200. Particularly, the flash memory device 1100 turns off discharge transistors when performing the erase operation, and thus prevents a leakage current from flowing in a bulk region during an erase interval. The flash memory device 1100 turns on the discharge transistors in a setup interval when performing a verification operation, thereby discharging global bit lines.

The memory controller 1200 includes a flash interface 1210, a host interface 1220, an Error Correction Code (ECC) circuit 1230, a Central Processing Unit (CPU), and a buffer memory 1250.

The flash interface 1210 is used to exchange commands, addresses and data with the flash memory device 1100. That is, the flash interface 1210 provides a read command and a read address in the read operation, and provides a writing command, a writing address and a writing data in the writing operation. The host interface 1220 receives a request to writing or read from a host, or provides data in response to the request of the host.

The ECC circuit 1230 generates a parity bit (or an ECC data) with data that is transmitted to the flash memory device 1100. The parity bit that has been generated in this way is stored in the spare region of the flash memory device 1100. The ECC circuit 1230 detects the error of data that is read from the flash memory device 1100. When the detected error is within a correction range, the ECC circuit 1230 corrects the detected error. The ECC circuit 1230 may be disposed inside/outside the memory controller 1200 according to the memory system 1000.

The CPU 1240 controls the writing or read operation of the flash memory device 1100 in response to the request of the host. The buffer memory 1250 may temporarily store data that is read from the flash memory device 1100 or data that is provided from the host. Moreover, the buffer memory 1250 may be used to drive a firmware such as a Flash Translation Layer (FTL). The FTL is operated by the CPU 1240. The buffer memory 1250 may be implemented with a DRAM and an SRAM.

The buffer memory 1250 may store table information necessary for the management of read error information. The table information is stored in the meta region of the flash memory device 1100 as metadata according to the control of the CPU 1240. The table information is copied from the meta region to the buffer memory 1250 on power up. Although not shown, the memory system 1000 may further include a ROM that stores a code data for interface with the host.

Figure 7:
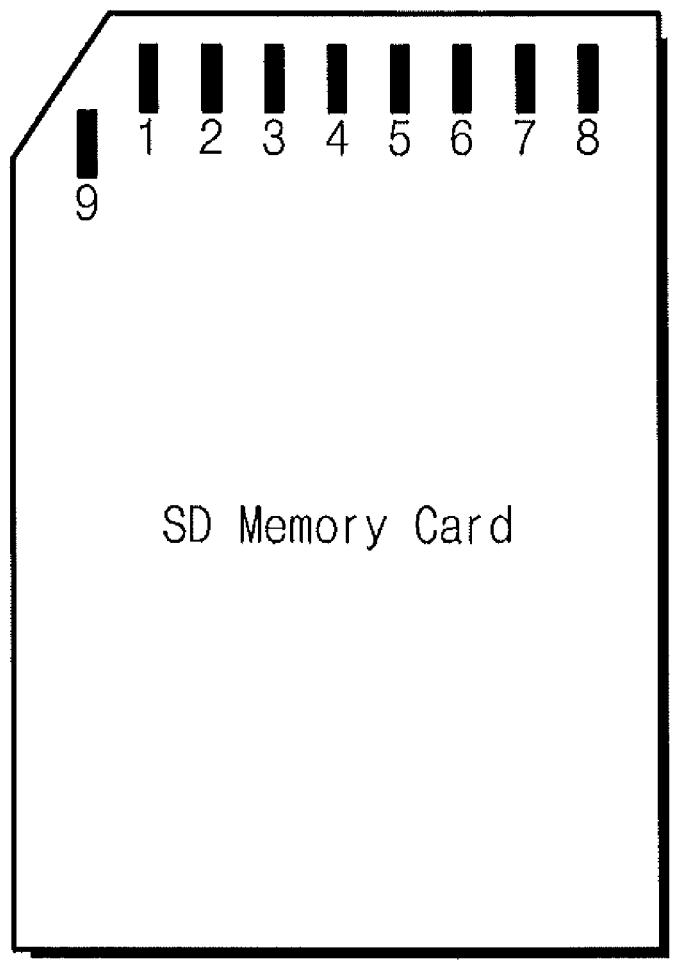
FIG. 7 is a block diagram illustrating a memory card which includes a flash memory device, according to an embodiment of the inventive concept.

FIG. 7 is a block diagram illustrating a memory card which includes a flash memory device, according to an embodiment of the inventive concept. FIG. 7 illustrates the external shape of an SD card among a memory card.

Referring to FIG. 7, the SD card includes nine pins. The SD card includes four data pins (for example, pin numbers 1, 7, 8 and 9), one command pin (for example, a pin number 2), one clock pin (for example, a pin number 5), and three power source pins (for example, pin numbers 3, 4 and 6).

Herein, a command and a response signal are transferred through the command pin (for example, a pin number 2). Generally, the command is transmitted from a host to the memory card, and the response signal is transmitted from the memory card to the host.

The memory system 1000 according to an embodiment of the inventive concept may be implemented with a portable storage device such as an SD card. The memory system 1000 may include the flash memory device 1100 and the memory controller 1200 for controlling the flash memory device 1100.

The flash memory device 1100 may perform an erase operation, a writing operation and a read operation according to the control of the memory controller 1200. Particularly, the flash memory device 1100 turns off discharge transistors when performing the erase operation, and thus prevents a leakage current from flowing in a bulk region during an erase interval. The flash memory device 1100 turns on the discharge transistors in a setup interval when performing a verification operation, thereby discharging global bit lines.

It will be understood that a memory card can be a Multi-Media Card (MMC)/Secure Digital (SD) form-factor compliant memory card. As used herein, the term "form-factor" means the physical size and shape of the memory card. Moreover, the form-factor of memory cards according to some embodiments of the invention is described herein as a Multi-Media Card (MMC)/Secure Digital memory card that has a size and shape that allows such memory cards to be used with other compliant devices, such as readers. As known to those skilled in the art, SD represents a later developed version of the MMC standard which may allow MMC compliant memory cards to be used with SD compliant devices. In some embodiments of the inventive concept, MMC/SD form-factor compliant devices measure about 32 mm×about 24 mm×about 1.4 mm and can be shaped substantially as shown in FIG. 12. The MMC and SD standards are discussed further on the world-wide-web at "mmca.org."

Figure 8:
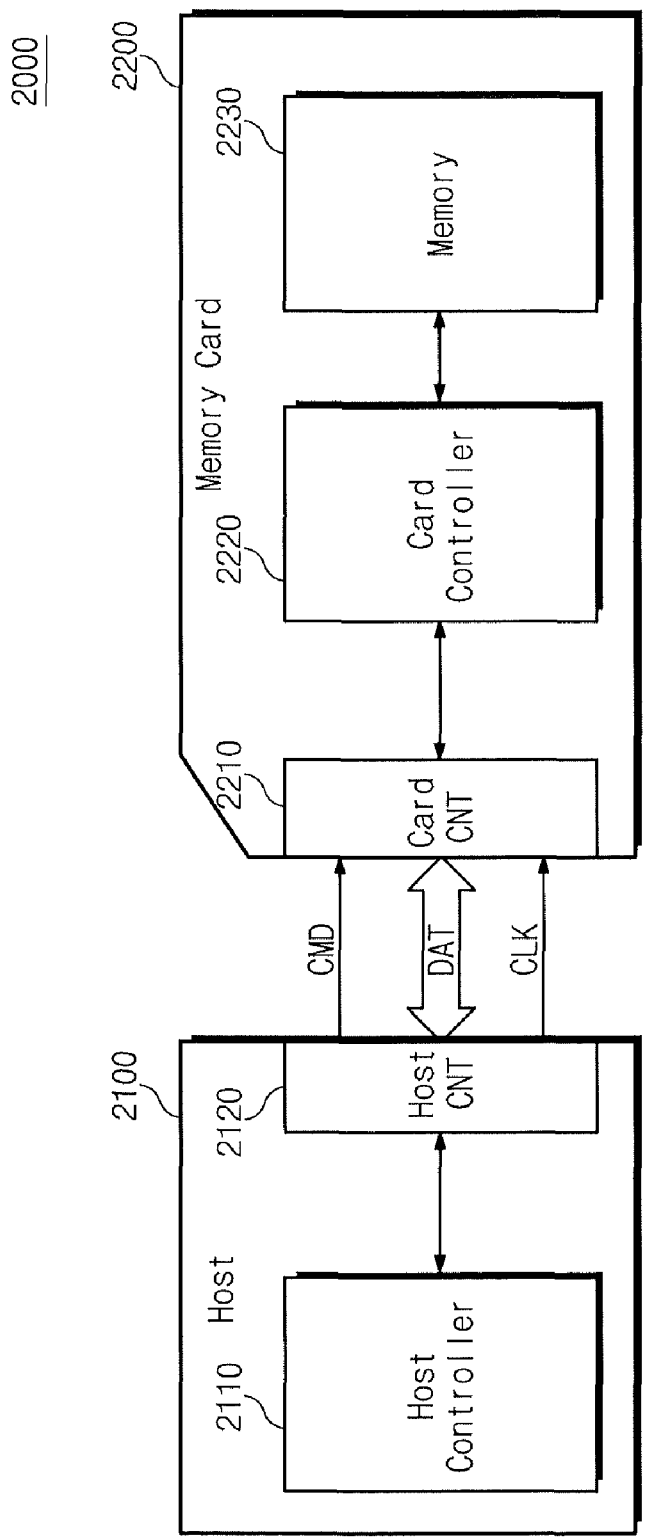
FIG. 8 is a block diagram illustrating a connection relationship between a host and the memory card of FIG. 7 and the internal configuration of the memory card.

FIG. 8 is a block diagram illustrating a connection relationship between a host and the memory card of FIG. 7 and the internal configuration of the memory card.

The memory card system 2000 includes a host 2100 and a memory card 2200. The host 2100 includes a host controller 2110 and a host connection unit 2120. The memory card 2200 includes a card connection unit 2210, a card controller 2220, and a memory 2230.

The host connection unit 2120 and the card connection unit 2210 include a plurality of pins. The plurality of pins include a command pin, a data pin, a clock pin, and a power source pin. The number of pins varies according to the kind of the memory card 2200. Exemplarily, an SD card includes nine pins.

The host 2100 writes data in the memory card 2200 or reads data that is stored in the memory card 2200. The host controller 2110 transmits a command (for example, a writing command), a clock signal CLK that is generated in the clock generator (not shown) of the host 2100 and data DAT to the memory card 2200 through the host connection unit 2120.

The card controller 2220 stores data in the memory 2230 in synchronization with the clock signal CLK that is generated in the clock generator (not shown) of the card controller 2220, in response to a writing command received through the card connection unit 2210. The memory 2230 stores data that is transmitted from the host 2100. For example, when the host 2100 is a digital camera, the memory 2230 stores an image data.

The memory system 1000 according to an embodiment of the inventive concept may be implemented as the memory card system 2000. The memory system 1000 includes the flash memory device 1100 and the memory controller 1200. Herein, the flash memory device 1100 may be implemented as the memory 2230, and the memory controller 1200 may be implemented as the card controller 2220.

The flash memory device 1100 may perform an erase operation, a writing operation and a read operation according to the control of the memory controller 1200. Particularly, the flash memory device 1100 turns off discharge transistors when performing the erase operation, and thus prevents a leakage current from flowing in a bulk region during an erase interval. The flash memory device 1100 turns on the discharge transistors in a setup interval when performing a verification operation, thereby discharging global bit lines.

Figure 9:
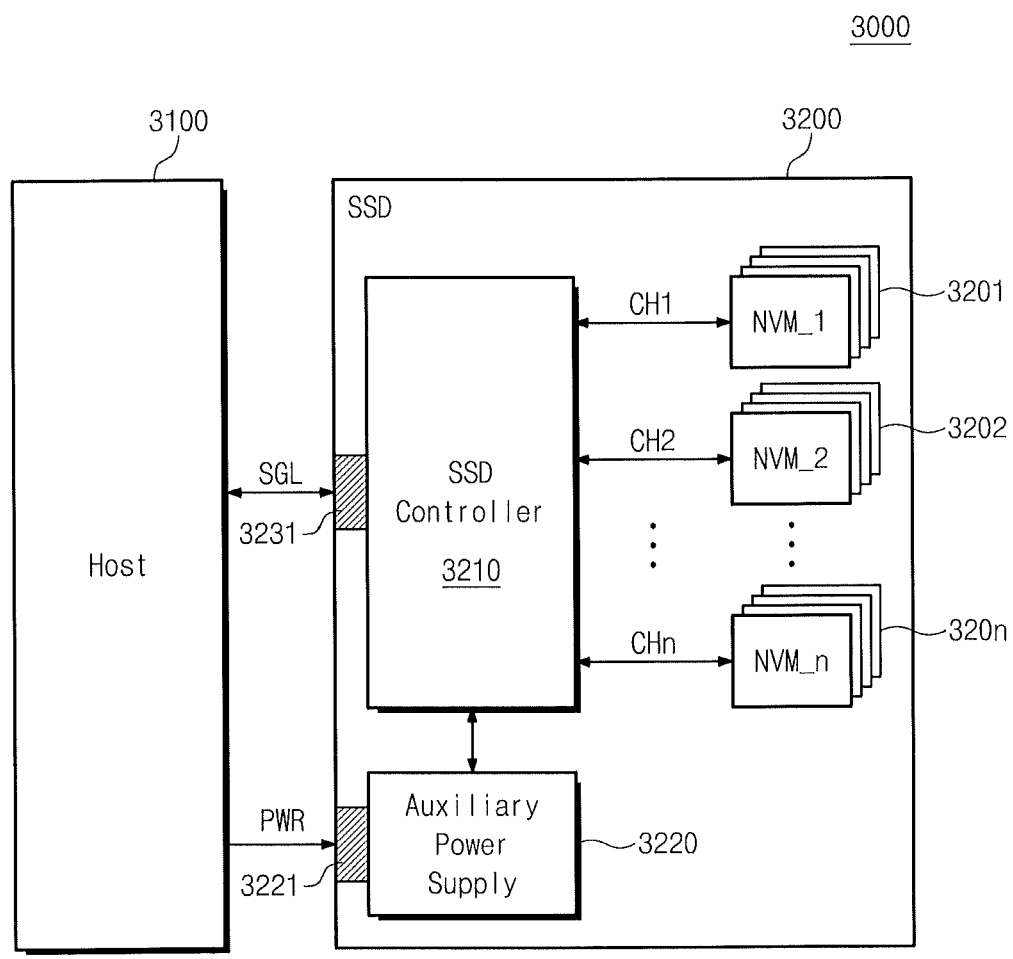
FIG. 9 is a block diagram illustrating an example of a Solid State Drive (SSD) which is implemented with a flash memory device according to an embodiment of the inventive concept.

FIG. 9 is a block diagram illustrating an example of a Solid State Drive (SSD) which is implemented with a flash memory device according to an embodiment of the inventive concept.

Referring to FIG. 9, an SSD system 3000 according to an embodiment of the inventive concept includes a host 3100 and an SSD 3200. The SSD 3200 exchanges a signal with the host 3100 through a signal connector 3231, and receives a power source through a power connector 3221. The SSD 3200 includes a plurality of nonvolatile memory devices 3201 to 320*n*, an SSD controller 3210, and an auxiliary power supply 3220.

Each of the plurality of nonvolatile memory devices 3201 to 320*n* is used as the storage device of the SSD 3200. Each of the plurality of nonvolatile memory devices 3201 to 320*n* may be implemented as a flash memory device having a large-capacity storage ability. The SSD 3200 mainly uses a flash memory, but a nonvolatile memory device such as PRAM, MRAM, ReRAM and FRAM other than a flash memory may be used.

The plurality of nonvolatile memory devices 3201 to 320*n* may be connected to the SSD controller 3210 through a plurality of channels CH1 to CHn. One or more memory devices may be connected to one channel. Memory devices connected to one channel may be connected to the same data bus.

The SSD controller 3210 exchanges a signal SGL with the host 3100 through the signal connector 3231. Herein, examples of the signal may include a command, an address and data. The SSD controller 3210 writes data in a corresponding memory device or reads data from a corresponding memory device according to the command of the host 3100. The internal configuration of the SSD controller 3210 will be described below in detail with reference to FIG. 10.

The auxiliary power supply 3220 is connected to the host 3100 through the power connector 3221. The auxiliary power supply 3220 may be charged with a power PWR that is applied from the host 3100. The auxiliary power supply 3220 may be disposed inside the SSD 3200, or may be disposed outside the SSD 3200. For example, the auxiliary power supply 3220 may be disposed in a main board, and may supply an auxiliary power source to the SSD 3200.

The memory system 1000 according to an embodiment of the inventive concept may be implemented as the SSD system 3000. The memory system 1000 may include the flash memory device 1100 and the memory controller 1200 for controlling the flash memory device 1100. Herein, the flash memory device 1100 may be implemented as each of the plurality of nonvolatile memory devices 3201 to 320*n*, and the memory controller 1200 may be implemented as the SSD controller 3210.

The flash memory device 1100 may perform an erase operation, a writing operation and a read operation according to the control of the memory controller 1200. Particularly, the flash memory device 1100 turns off discharge transistors when performing the erase operation, and thus prevents a leakage current from flowing in a bulk region during an erase interval. The flash memory device 1100 turns on the discharge transistors in a setup interval when performing a verification operation, thereby discharging global bit lines.

Figure 10:
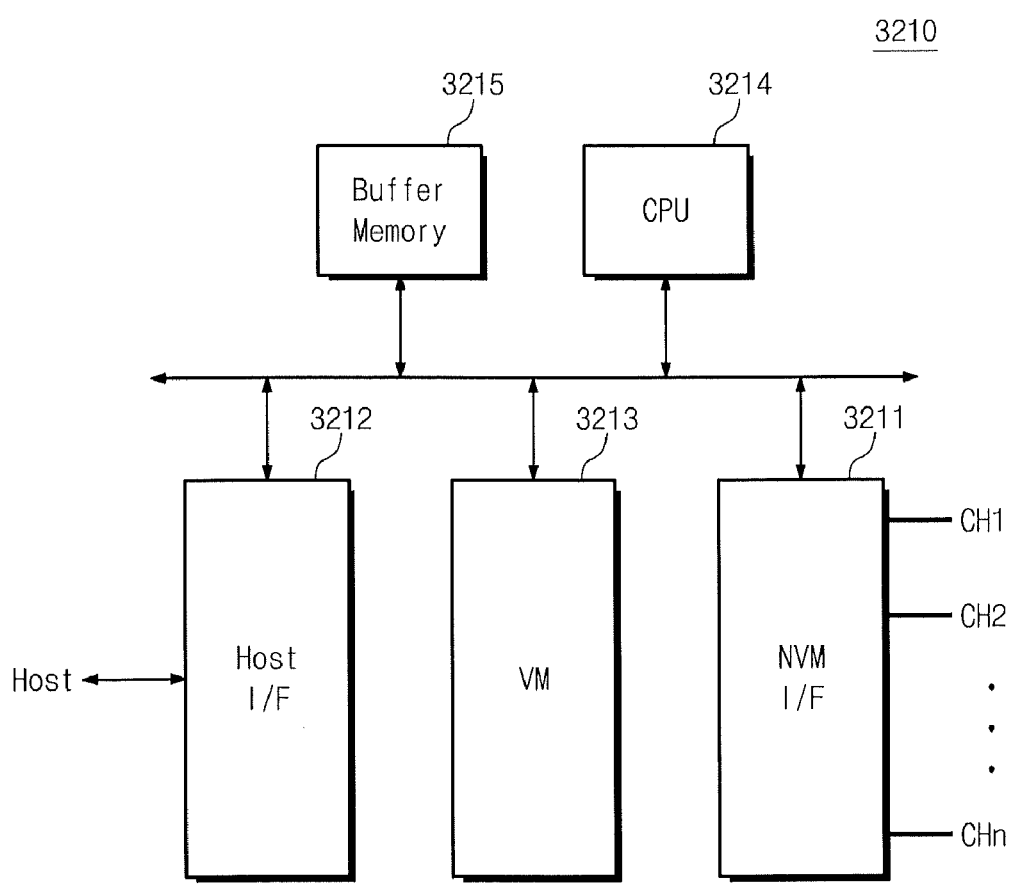
FIG. 10 is a block diagram exemplarily illustrating the configuration of an SSD controller in FIG. 9.

FIG. 10 is a block diagram exemplarily illustrating the configuration of the SSD controller in FIG. 9.

Referring to FIG. 10, the SSD controller 3210 includes an NVM interface 3211, a host interface 3212, an ECC circuit 3213, a CPU 3214, and a buffer memory 3215.

The NVM interface 3211 scatters data, which are transferred from the buffer memory 3215, to the channels CH1 to CHn, The NVM interface 3211 transfers data, which are read from the nonvolatile memory devices 3201 to 320n, to the buffer memory 3215. Herein, the NVM interface 3211 may use the interface scheme of a NAND flash memory. That is, the SSD controller 3210 may perform a programming operation, a read operation and an erase operation according to the interface scheme of the NAND flash memory.

The host interface 3212 provides interface with the SSD 3200 in response to the protocol of the host. The host interface 3212 may communicate with the host with Universal Serial Bus (USB), Small Computer System Interface (SCSI), PCI express, ATA, Parallel ATA (PATA), Serial ATA (SATA) and Serial Attached SCSI (SAS). Moreover, the host interface 3212 may perform a disk emulation function of supporting a function that allows the host to recognize the SSD 3200 as a Hard Disk Drive (HDD).

The ECC circuit 3213 generates a parity bit with data that is transmitted to the nonvolatile memory devices 3201 to 320n. The parity bit that has been generated in this way is stored in each of the spare regions of the nonvolatile memory devices 3201 to 320n. The ECC circuit 3213 detects the error of data that is read from the nonvolatile memory devices 3201 to 320n. When the detected error is within a correction range, the ECC circuit 3213 corrects the detected error.

The CPU 3214 analyzes and processes a signal SGL that is inputted from the host. The CPU 3214 controls the host or the nonvolatile memory devices 3201 to 320n through the host interface 3212 or the NVM interface 3211. The CPU 3214 controls the operations of the nonvolatile memory devices 3201 to 320n according to a firmware for driving the SSD 3200.

The buffer memory 3215 temporarily stores a writing data that is provided from the host or data that is read from the nonvolatile memory device. Moreover, the buffer memory 3215 may store metadata or cache data to be stored in the nonvolatile memory devices 3201 to 320n. In a sudden power-off operation, the metadata or cache data that is stored in the buffer memory 3215 is stored in the nonvolatile memory devices 3201 to 320n, The buffer memory 3215 may include a DRAM and an SRAM.

Figure 11:
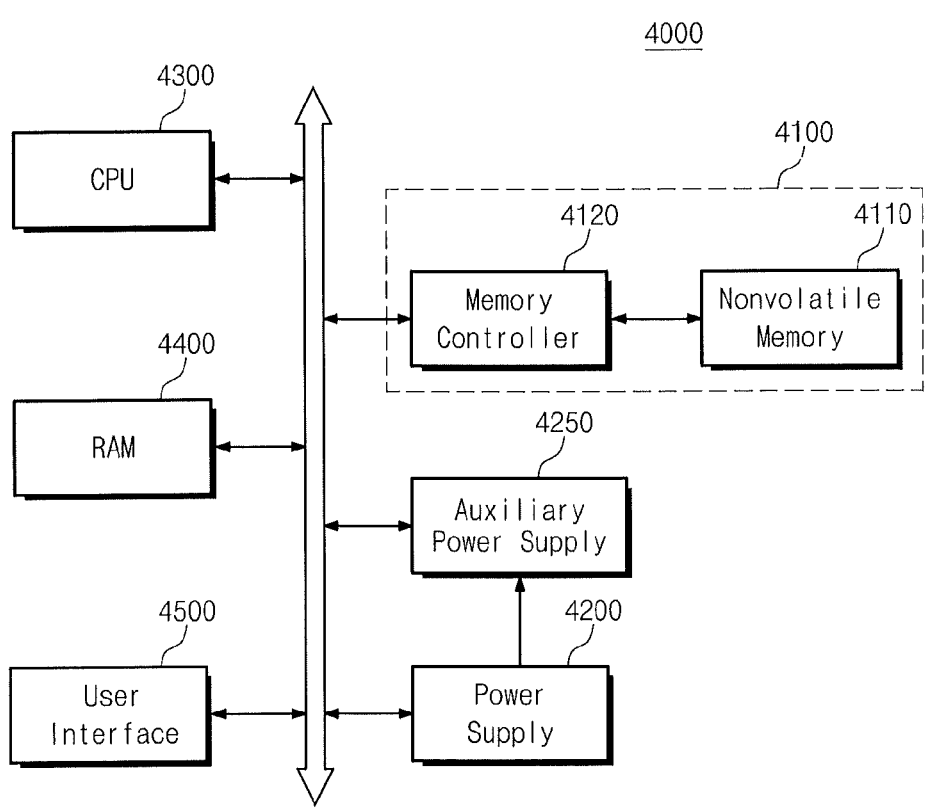
FIG. 11 is a block diagram illustrating an example of an electronic device which is implemented with a flash memory device according to an embodiment of the inventive concept.

FIG. 11 is a block diagram illustrating an example of an electronic device which is implemented with a flash memory device according to an embodiment of the inventive concept. Herein, an electronic device 4000 according to an embodiment of the inventive concept may be implemented as a Personal Computer (PC), or may be implemented as a portable electronic device such as a notebook computer, a portable phone, a Personal Digital Assistant (PDA) and a camera.

Referring to FIG. 11, the electronic device 4000 includes a memory system 4100, a power supply 4200, an auxiliary power supply 4250, a CPU 4300, a RAM 4400, and a user interface 4500. The memory system 4100 includes a flash memory 4110 and a memory controller 4120.

The memory system 1000 according to an embodiment of the inventive concept may be implemented as the memory system 4100 of the electronic device 4000. The memory system 1000 may include the flash memory device 1100 and the memory controller 1200 for controlling the flash memory device 1100. Herein, the flash memory device 1100 may be implemented as the flash memory 4110 of the electronic device 4000, and the memory controller 1200 may be implemented as the memory controller 4120 of the electronic device 4000.

The flash memory device 1100 may perform an erase operation, a writing operation and a read operation according to the control of the memory controller 1200. Particularly, the flash memory device 1100 turns off discharge transistors when performing the erase operation, and thus prevents a leakage current from flowing in a bulk region during an erase interval. The flash memory device 1100 turns on the discharge transistors in a setup interval when performing a verification operation, thereby discharging global bit lines.

The flash memory device and the operation method thereof according to embodiments of the inventive concept treat the test result of the erase operation, which is performed in memory block units, as a pass even when a failure due to a manufacture process arises in the flash memory device, and apply the repair scheme of a column unit in a function test, thereby improving repair efficiency.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A flash memory device, comprising:
   a memory cell configured to store data;
   a local bit line connected to the memory cell;
   a global bit line connected to the local bit line;
   a switch unit configured to selectively connect the local bit line to the global bit line;
   a discharge transistor connected to the global bit line, and configured to selectively connect the global bit line to a reference level responsive to a discharge control signal; and
   a discharge control circuit, connected to the discharge transistor via the discharge control signal, and configured to selectively disable the discharge transistor during an erase interval occurring before a verify interval of an erase verification operation carried out by the flash memory device wherein the switch unit electrically disconnects the local bit line from the global bit line during the erase interval included in a wafer level burn-in test interval.

2. The flash memory device of claim 1, wherein the discharge control circuit enables the discharge transistor during a setup interval included in the verify interval of the erase verification operation.

3. The flash memory device of claim 2, wherein the discharge control circuit generates the discharge control signal to enable the discharge transistor after the erase interval.

4. The flash memory device of claim 3 further comprising:
   a word line connected to the memory cell, wherein the discharge control circuit generates the discharge control signal to disable the discharge transistor when a verification reference voltage is applied to the word line.

5. The flash memory device of claim 3, wherein the discharge control circuit generates the discharge control signal to disable the discharge transistor the pre-charge interval of the verify interval included in the erase verification operation.

6. A method of operating a non-volatile memory device, the method comprising:
- electrically disconnecting a local bit line from a global bit line during an erase interval;
- disabling a discharge transistor during the erase interval before a verify interval, the discharge transistor being connected to the global bit line to block leakage current from flowing between the local bit line and the global bit line, wherein the erase interval is included in a wafer level burn-in test interval.

7. The operation method of claim 6, further comprising:
- enabling the discharge transistor during the verify interval; and
- again disabling the discharge transistor during a remainder of the verify interval after an end of a setup interval of the verify interval.

8. The operation method of claim 7, further comprising:
- disabling the discharge transistor when a verification reference voltage is applied to a word line.

9. The operation method of claim 8, further comprising:
- maintaining the discharge transistor as disabled while the verification reference voltage is applied to the word line.

10. The operation method of claim 6, further comprising:
- enabling the discharge transistor after the erase interval.

11. The operation method of claim 10, further comprising:
- maintaining the discharge transistor as enabled during a setup interval of the verify interval.

12. A flash memory device, comprising:
- a memory cell configured to store data;
- a local bit line connected to the memory cell;
- a global bit line connected to the local bit line;
- a switch unit configured to selectively connect the local bit line to the global bit line;
- a discharge transistor connected to the global bit line, and configured to selectively connect the global bit line to a reference level responsive to a discharge control signal; and
- a discharge control circuit, connected to the discharge transistor via the discharge control signal, and configured to selectively disable the discharge transistor during an erase interval occurring before a verify interval of an erase verification operation carried out by the flash memory device, wherein the switch unit electrically disconnects the local bit line from the global bit line during the erase interval including in a wafer level burn-in test interval.

* * * * *